(12) United States Patent
Qiao et al.

(10) Patent No.: US 10,826,274 B2
(45) Date of Patent: Nov. 3, 2020

(54) GRATING STRUCTURE FOR SURFACE-EMITTING LASER

(71) Applicant: Lumentum Operations, LLC, Milpitas, CA (US)

(72) Inventors: Pengfei Qiao, Albany, CA (US); Chien-Yao Lu, Fremont, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 16/269,139

(22) Filed: Feb. 6, 2019

(65) Prior Publication Data

US 2019/0252857 A1 Aug. 15, 2019

Related U.S. Application Data

(60) Provisional application No. 62/629,515, filed on Feb. 12, 2018.

(51) Int. Cl.
*H01S 5/183* (2006.01)
*H01S 5/024* (2006.01)
*H01S 5/20* (2006.01)

(52) U.S. Cl.
CPC ...... *H01S 5/18355* (2013.01); *H01S 5/18341* (2013.01); *H01S 5/18386* (2013.01); *H01S 5/02469* (2013.01); *H01S 5/18308* (2013.01); *H01S 5/18311* (2013.01); *H01S 5/18319* (2013.01); *H01S 5/18361* (2013.01); *H01S 5/2063* (2013.01)

(58) Field of Classification Search
CPC ............. H01S 5/18355; H01S 5/18341; H01S 5/18369; H01S 5/02469; H01S 5/18308; H01S 5/18311; H01S 5/18319; H01S 5/18361; H01S 5/2063
See application file for complete search history.

(56) References Cited

U.S. PATENT DOCUMENTS

| | | | |
|---|---|---|---|
| 6,055,262 | A | 4/2000 | Cox et al. |
| 6,782,027 | B2 | 8/2004 | Cox et al. |
| 6,836,501 | B2 | 12/2004 | Cox et al. |
| 7,288,421 | B2 | 10/2007 | Cox et al. |
| 7,627,018 | B1 | 12/2009 | Guilfoyle et al. |
| 8,000,374 | B2 | 8/2011 | Johnson et al. |
| 8,451,875 | B2 | 5/2013 | Johnson |
| 8,455,279 | B2 | 6/2013 | Johnson et al. |

(Continued)

OTHER PUBLICATIONS

Larsson et al., "High Speed VCSELs and VCSEL Arrays for Single and Multicore Fiber Interconnects", Mar. 4, 2015, 11 pages.

(Continued)

*Primary Examiner* — Armando Rodriguez
(74) *Attorney, Agent, or Firm* — Harrity & Harrity, LLP (57) ABSTRACT

A vertical-cavity surface-emitting laser (VCSEL) may include at least one layer forming a grating structure with a selected period, depth, and fill factor, wherein the period, the depth, and the fill factor of the grating structure are configured to achieve greater than a threshold level of efficiency for the VCSEL, less than a threshold current increase caused by power loss from higher order diffraction associated with the grating structure, and greater than a threshold polarization selectivity at an emission wavelength of the VCSEL.

20 Claims, 7 Drawing Sheets

(56) References Cited

U.S. PATENT DOCUMENTS

2010/0316083 A1* 12/2010 Chang-Hasnain ... G02B 5/0816
372/50.11

OTHER PUBLICATIONS

Kasten et al., "Photonic Crystal Vertical Cavity Lasers With Wavelength-Independent Single-Mode Behavior", Dec. 1, 2008, 3 pages.
Czyszanowski et al., "Subwavelength grating as both emission mirror and electrical contact for VCSELs in any material system", Jan. 12, 2017, 11 pages.
Huang et al., "A nanoelectromechanical tunable laser", Feb. 24, 2008, 5 pages.
Robert Magnusson, "Wideband reflectors with zero-contrast gratings", Jul. 18, 2014, 4 pages.
Haglund et al., "Single Fundamental-Mode Output Power Exceeding 6 mW From VCSELs With a Shallow Surface Relief", Feb. 2004, 3 pages.
Viktorovitch et al., "3D harnessing of light with 2.5D photonic crystals", Sep. 28, 2009, 13 pages.
Mateus et al., "Broad-band mirror (1.12-1.62 μm) using a subwavelength grating", Jun. 28, 2004, 3 pages.

* cited by examiner

FIG. 2D

GRATING STRUCTURE FOR SURFACE-EMITTING LASER

RELATED APPLICATION(S)

This application claims priority under 35 U.S.C. § 119 to U.S. Provisional Application No. 62/629,515, filed on Feb. 12, 2018, the content of which is incorporated by reference herein in its entirety.

TECHNICAL FIELD

The present disclosure relates to grating structures. More particularly, some aspects of the present disclosure relate to a hybrid grating structure for a surface-emitting laser, such as a vertical cavity surface-emitting laser (VCSEL).

BACKGROUND

A surface-emitting laser, such as a top-emitting vertical cavity surface-emitting laser (VCSEL), a bottom-emitting VCSEL, and/or the like may include a grating as a mirror for the VCSEL. High contrast gratings (HCGs), which may be associated with a threshold difference in refractive index between a grating structure and a surrounding environment of the grating structure, may be selected for VCSELs to achieve high-speed wavelength tuning. For example, a micro-electro-mechanical (MEMS) actuator may control an HCG to tune a VCSEL at a configured emission wavelength. Using an HCG may provide, in addition to high-speed wavelength tuning, polarization control, and transverse mode control, and may enable a reduction in VCSEL size relative to using another type of reflector that may be used in the VCSEL.

SUMMARY

According to some possible implementations, a vertical-cavity surface-emitting laser (VCSEL) may include at least one layer forming a grating structure with a selected period, depth, and fill factor, wherein the period, the depth, and the fill factor of the grating structure are configured to achieve greater than a threshold level of efficiency for the VCSEL, less than a threshold current increase caused by power loss from higher order diffraction associated with the grating structure, and greater than a threshold polarization selectivity at an emission wavelength of the VCSEL.

According to some possible implementations, a high-efficiency hybrid grating of a vertical-cavity surface-emitting laser (VCSEL) may include a plurality of grating layers, wherein at least one of the grating layers forms a grating structure with a particular period, depth, and fill factor, wherein the plurality of grating layers is continuous without an airgap separating portions of the plurality of grating layers, and wherein the period, depth, and fill factor of the grating structure are configured to achieve high efficiency, reduced higher-order diffraction, and high polarization selectivity at an emission wavelength of the VCSEL.

According to some possible implementations, an optical system may include a vertical-cavity surface-emitting laser (VCSEL). The optical system may include a grating disposed in an optical path of the VCSEL. The grating may include a set of grating layers with a first refractive index and of a first material, wherein a difference between the first refractive index and a second refractive index of an interface matched to the set of grating layers is less than a threshold difference, wherein the interface is of a second material that is different from the first material, wherein the grating is associated with a threshold thermal boundary resistance, and wherein a period, a depth, and a fill factor of the grating are configured to achieve high efficiency, low current increase, and high polarization selectivity at an emission wavelength of the VCSEL.

DETAILED DESCRIPTION

The following detailed description of example implementations refers to the accompanying drawings. The same reference numbers in different drawings may identify the same or similar elements.

A vertical cavity surface-emitting laser (VCSEL) may suspend a grating (e.g., a high contrast grating (HCG)) in an air gap to achieve a threshold difference in refractive index for the grating. Similarly, a VCSEL may include a grating that is surrounded with a low refractive index material (e.g., a material with less than a threshold refractive index), to achieve the threshold difference in refractive index. In this way, the grating may enable wavelength tuning for the VCSEL, polarization control, transverse mode control, and/or the like. Moreover, using a grating as a mirror for a VCSEL may reduce a size of the VCSEL relative to other types of mirrors. However, using an air gap or low refractive index material to suspend the grating may result in a poor thermal boundary resistance, which may result in excessive heat buildup in the grating. Moreover, such a VCSEL may be associated with a relatively low efficiency, greater than a threshold amount of power loss from higher order diffraction, which may cause a threshold increase in current to account for the threshold amount of power loss, and less than a threshold level of polarization selectivity at an emission wavelength of the VCSEL.

Some implementations described herein enable improved thermal performance, improved efficiency, reduced power loss, reduced current requirements, and increased polarization selectivity for a VCSEL that includes a grating. For example, a hybrid grating structure may be included in a VCSEL to obviate a need for an air gap and/or a low refractive index material to suspend the grating. In this way, the hybrid grating structure may be associated with improved thermal boundary resistance, thereby reducing heat buildup and improving performance of the VCSEL. Moreover, the hybrid grating structure may be configured with a grating period, a grating depth, and a grating fill factor optimized to improve emission efficiency for a VCSEL relative to other VCSELs. Furthermore, the grating period, the grating depth, and the grating fill factor may be configured to achieve less than a threshold power loss from higher order diffraction and greater than a threshold level of polarization selectively at an emission wavelength of the VCSEL, thereby improving performance of the VCSEL relative to other configurations.

Figure 1A:
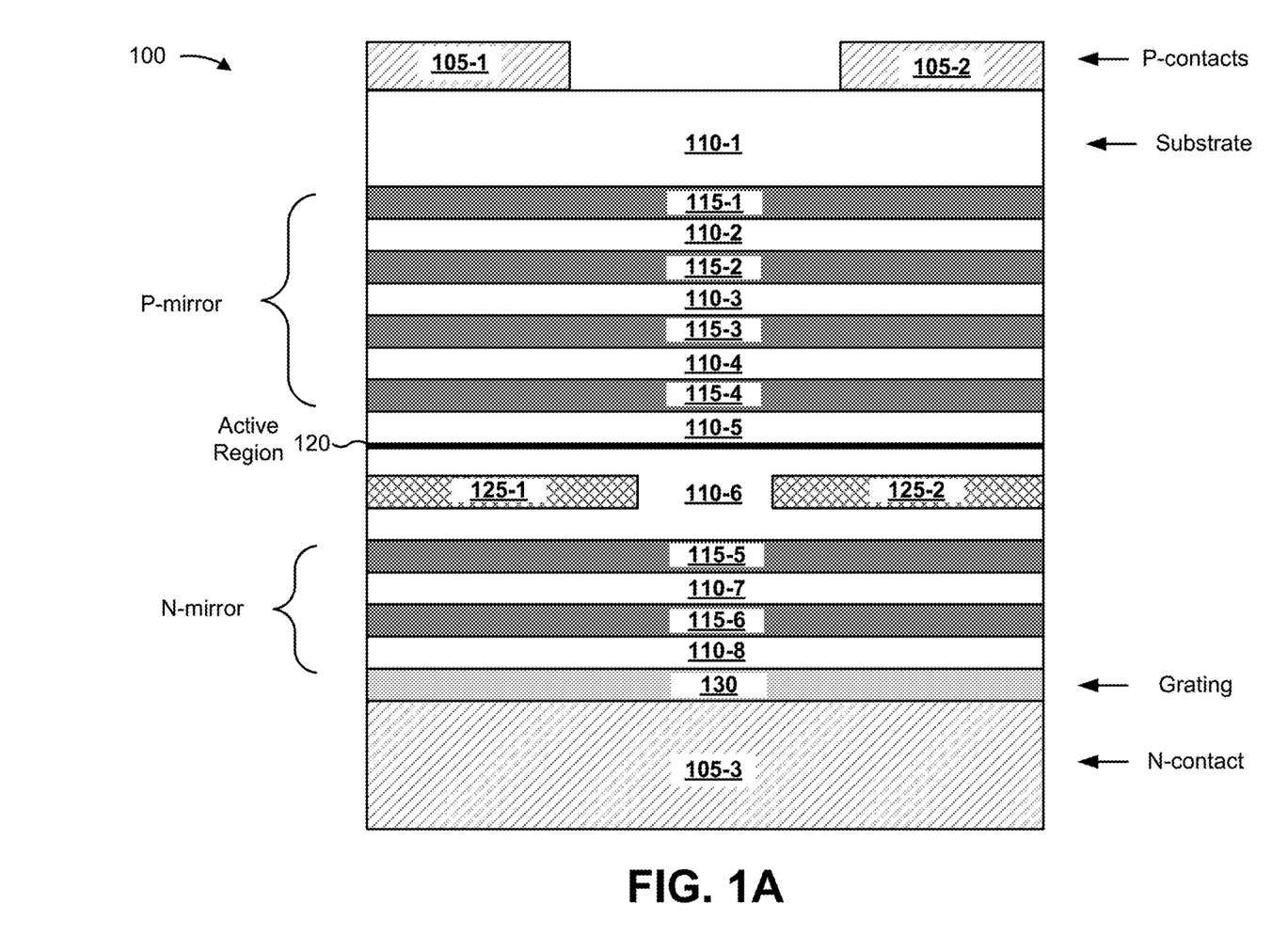
FIGS. 1A-1C are diagrams of examples of VCSELs described herein.
Figure 1B:
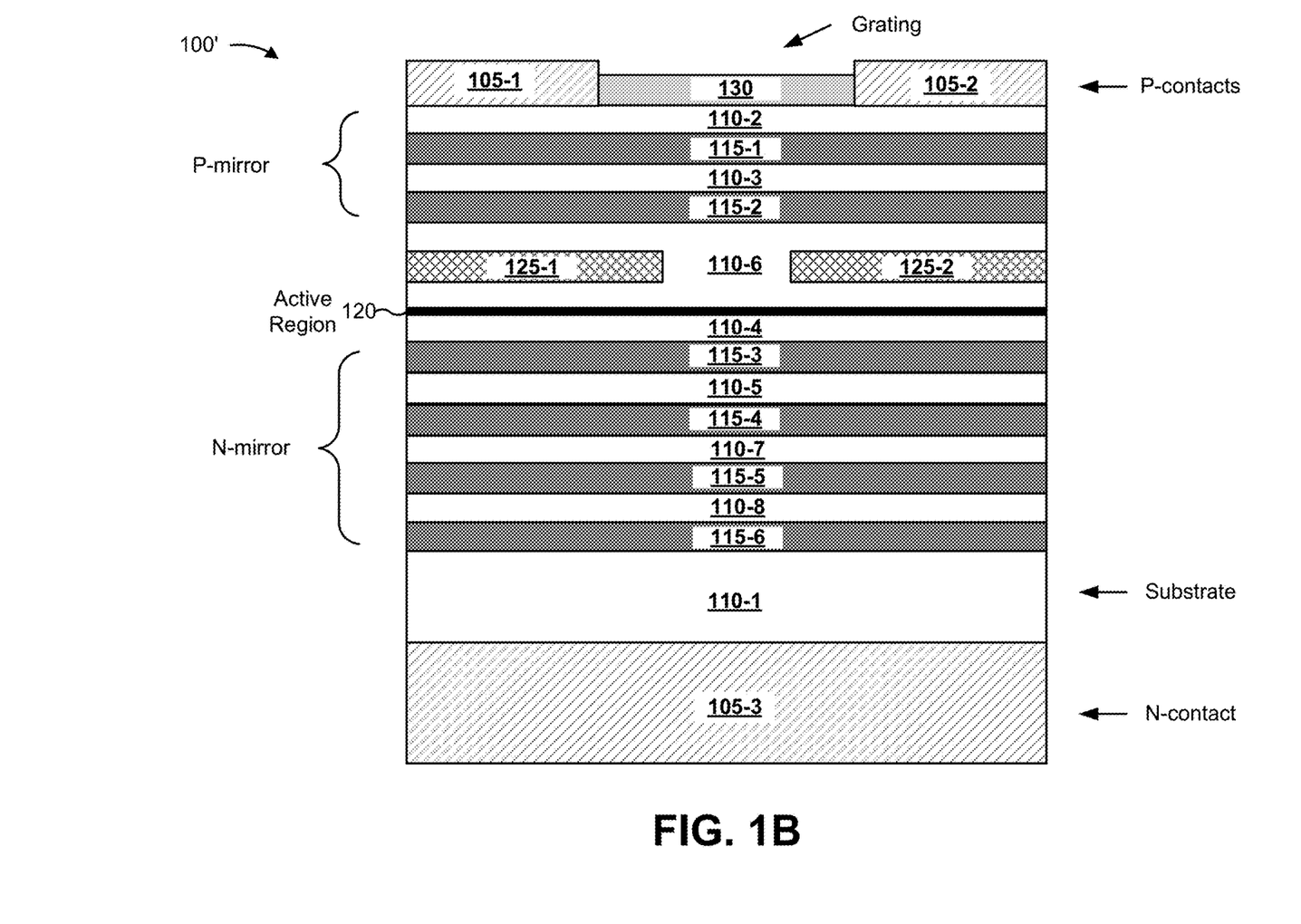
Figure 1C:
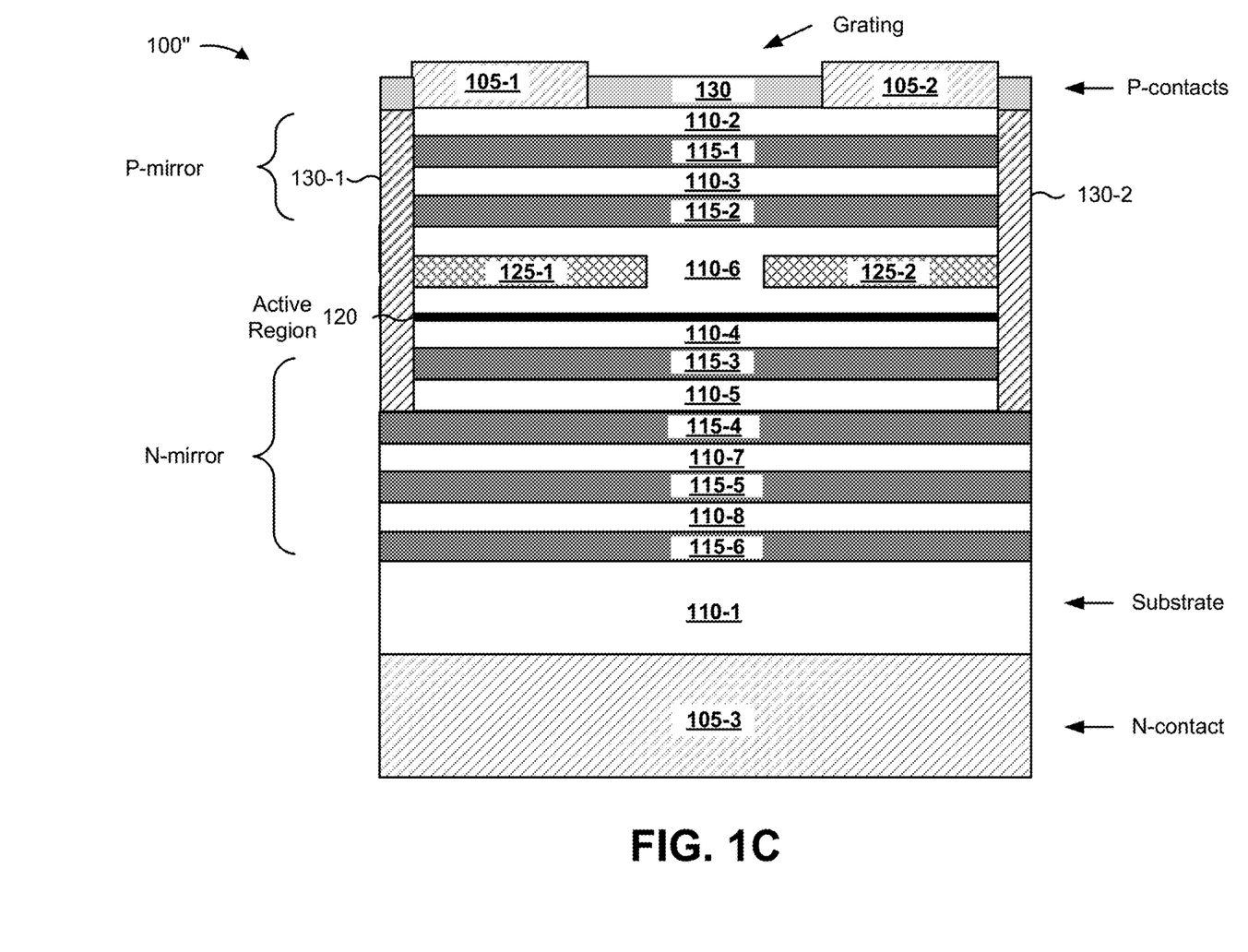

FIGS. 1A-1C are diagrams of examples of VCSELs 100/100'/100" described herein. As shown in FIGS. 1A-1C, VCSEL 100 may be a bottom-emitting (i.e., through the substrate) VCSEL and VCSELs 100' and 100" may be top-emitting VCSELs.

As further shown in FIG. 1A, VCSEL 100 may include a set of contacts 105 (which may be a single contact formed from a metallic ring), a set of layers 110, a set of layers 115, an active region formed by a layer 120, a set of layers 125, and a grating 130. For example, VCSEL 100 may include p-type ohmic contacts (P-contacts) formed from contacts 105-1 and 105-2; a substrate formed from layer 110-1; a p-type mirror (P-mirror) formed from alternating layers 110 and 115; an n-type mirror (N-mirror) formed from alternating layers 110 and layers 115; and an n-type ohmic contact (N-contact) formed from contact 105-3.

In some implementations, grating 130 may include one or more layers of material. For example, grating 130 may include a hybrid grating structure including three layers of material. In this case, grating 130 may be associated with a particular period, a particular depth, a particular fill factor, and/or the like. In some implementations, the particular period, the particular depth, and/or the particular fill factor may be selected to achieve one or more properties for VCSEL 100. For example, the particular period, the particular depth, the particular fill factor, and/or the like may be selected to achieve a threshold level of efficiency for VCSEL 100, less than a threshold amount of higher order diffraction (e.g., which may result in less than a threshold current increase requirement to account for the a threshold power loss relating to the higher order diffraction) for VCSEL 100, greater than a threshold polarization selectivity for VCSEL 100, and/or the like at an emission wavelength of the VCSEL 100.

In some implementations, the emission wavelength may be a particular lasing wavelength. For example, VCSEL 100 may be associated with an emission wavelength of approximately 940 nm. Additionally, or alternatively, VCSEL 100 may be associated with an emission wavelength of between approximately 850 nm and 1550 nm. In some implementations, VCSEL 100 may be associated with a particular polarization selectivity, such as a polarization selectivity of greater than or equal to 10 decibels (10 dB). In some implementations, VCSEL 100 may be associated with a particular current increase, such as a current increase of less than 10% in connection with higher order diffraction. In some implementations, VCSEL 100 may be associated with less than 10% power loss from higher order diffraction, less than 30% overall power loss relating to grating 130, and/or the like. In some implementations, VCSEL 100 may be associated with a threshold level of efficiency, such as greater than 32% wall-plug efficiency, and may be termed a high-efficiency VCSEL.

In some implementations, grating 130 may be associated with a particular index contrast. For example, grating 130 may be a high-contrast grating with a threshold index contrast between a surface of grating 130 and a material contacting the surface of grating 130 (e.g., another layer of material, an air interface, etc.) (or between different materials forming grating 130). Additionally, or alternatively, grating 130 may be a low-contrast grating with less than a threshold index contrast, such as less than approximately 0.5 difference in refractive indices of grating 130 and another material contacting a surface of grating 130 (or another material forming a part of grating 130). In some implementations, the particular period, the particular depth, the particular fill factor, and/or the like are selected based on the refractive index of grating 130. In some implementations, the surface of grating 130 may be a particular type of surface, as described in more detail herein. For example, grating 130 may be associated with a castellated surface (e.g., a set of exposed pillars), a planarized surface (e.g., a layer of material covering the set of pillars), and/or the like.

In some implementations, a layer of grating 130 may be a particular type of material. For example, grating 130 may include a semiconductor layer, a metal layer, a dielectric layer, and/or the like. In some implementations, grating 130 may include a particular combination of layers or interfaces forming a grating structure, as described in more detail herein, such as a semiconductor layer and a dielectric layer, a spacer layer and an air interface, a metal layer and an air interface, a semiconductor layer and an air interface, and/or the like. In some implementations, grating 130 may include a gallium-arsenide (GaAs) layer, a gold (Au) layer, an indium-gallium-phosphide (InGaP) layer, a silicon dioxide ($SiO_2$) layer, a silicon (Si) layer, a benzocyclobutene (BCB) layer, a silicon nitride ($SiN_x$) layer, and/or the like.

In some implementations, grating 130 may be a hybrid grating structure. For example, grating 130 may include at least one layer of dielectric material and at least one layer of metallic material. In some implementations, a layer of grating 130 (e.g., a metallic layer) may be a conductive layer for VCSEL 100. In this way, grating 130 may form both a portion of a contact layer and a mirror for VCSEL 100, thereby improving VCSELs relative to all-dielectric grating VCSELs that use a separate conductive layer. In some implementations, grating 130 may be disposed onto a distributed Bragg reflector (DBR) formed by layers 110 and layers 115 of VCSEL 100.

As shown in FIG. 1B, rather than grating 130 being disposed at a bottom of VCSEL 100 and contiguous to third contact 105-3, grating 130 may be disposed at a top of a top-emitting VCSEL 100' and bracketed by first contact 105-1 and second contact 105-2. In some implementations, contacts 105 may be a ring surrounding grating 130. In some implementations, grating 130 may form at least a part of contacts 105.

As shown in FIG. 1C, VCSEL 100" may include ion implants 130-1 and 130-2 that may bracket layers of VCSEL 100". For example, ion implants 130-1 and 130-2 may be disposed onto a surface of the p-type mirror, the oxide aperture layers 125, and the active region.

As indicated above, FIGS. 1A-1C are provided merely as examples. Other examples may differ from what is described with regard to FIGS. 1A-1C.

FIGS. 2A-2H are diagrams of examples of gratings 200-280 described herein. As shown in FIGS. 2A-2H, gratings 200-280 include respective sets of multiple layers to form respective grating structures of gratings 200-280.

Figure 2A:
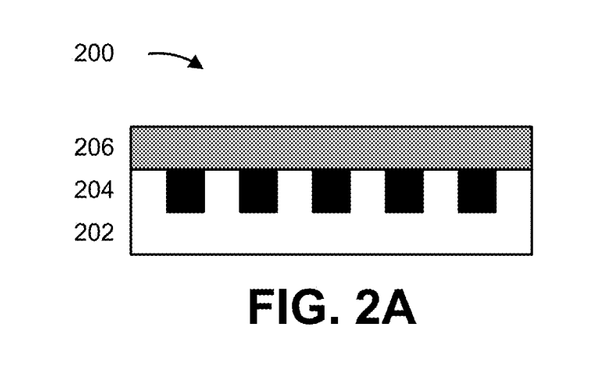
FIGS. 2A-2H are diagrams of examples of gratings described herein.

As shown in FIG. 2A, grating 200 includes a first layer 202, a second layer 204, and a third layer 206. In some implementations, first layer 202 may be a semiconductor layer. For example, first layer 202 may be a gallium-arsenide (GaAs) semiconductor. In some implementations, second layer 204 may be a semiconductor and dielectric grating layer. For example, second layer 204 may be a gallium-arsenide (GaAs) and benzocyclobutene (BCB) grating. In some implementations, third layer 206 may be a metal layer. For example, third layer 206 may be a gold layer. In this case, third layer 206 forms a planarized surface for grating 200. Further, grating 200 may form a hybrid grating structure that includes a dielectric layer (e.g., in second layer 204) and a metallic layer (e.g., in third layer 206). In this case, grating 200 may enable current conduction. Moreover, grating 200 may be epitaxially growable. Furthermore, grating 200 may be usable for a bottom-emitting VCSEL.

Figure 2B:
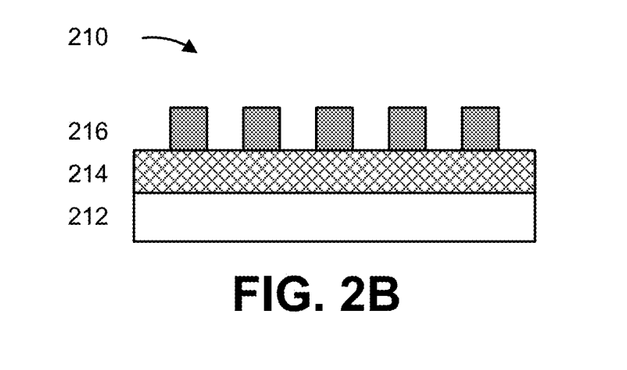

As shown in FIG. 2B, grating 210 includes a first layer 212, a second layer 214, and a third layer 216. In some implementations, first layer 212 may be a semiconductor layer (e.g., GaAs). In some implementations, second layer 214 may be a spacer layer. For example, second layer 214 may be a silicon dioxide (SiO$_2$) spacer. In this case, based on controlling a thickness of the silicon dioxide spacer, transmissivity and reflectivity performance may be optimized. In some implementations, third layer 216 may be a metal (e.g., Au) and air interface grating. In this case, third layer 216 forms a castellated surface for grating 210. Moreover, based on being metalized, third layer 216 enables current conduction, and may lower resistance of grating 210, thereby improving performance of a VCSEL that includes grating 210 relative to other configurations.

Figure 2C:
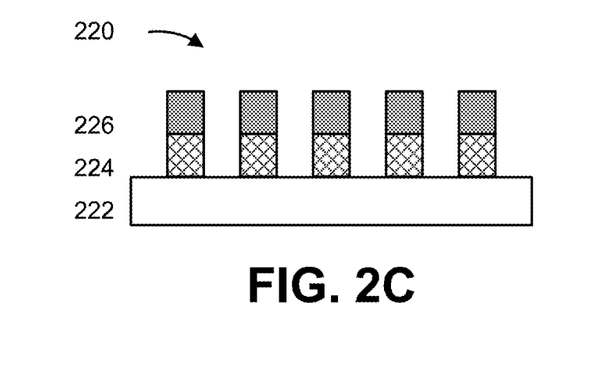

As shown in FIG. 2C, grating 220 includes a first layer 222, a second layer 224, and a third layer 226. In some implementations, first layer 222 may be a semiconductor layer (e.g., GaAs). In some implementations, second layer 224 may be a spacer (e.g., SiO$_2$) and air interface grating. In some implementations, third layer 226 may be a metal (e.g., Au) and air interface grating.

Figure 2D:
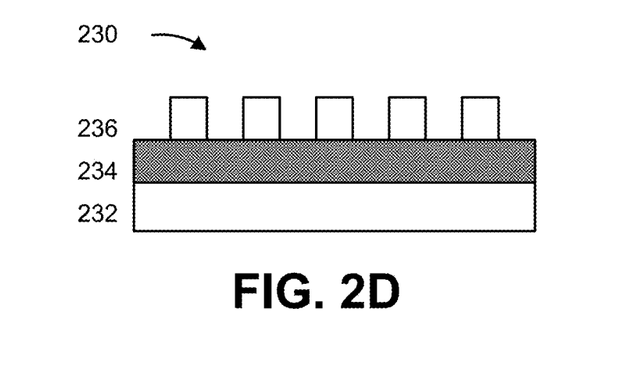

As shown in FIG. 2D, grating 230 includes a first layer 232, a second layer 234, and a third layer 236. In some implementations, first layer 232 may be a semiconductor layer (e.g., GaAs). In some implementations, second layer 234 may be a spacer layer. For example, second layer 234 may be a silicon dioxide (SiO$_2$) spacer, an indium-gallium-phosphide (InGaP) spacer, a silicon nitride (SiN$_x$) spacer, and/or the like. In some implementations, third layer 236 may be a semiconductor and air interface grating. For example, third layer 236 may include gallium-arsenide (GaAs) matched to an air interface, silicon (Si) matched to an air interface, and/or the like.

Figure 2E:
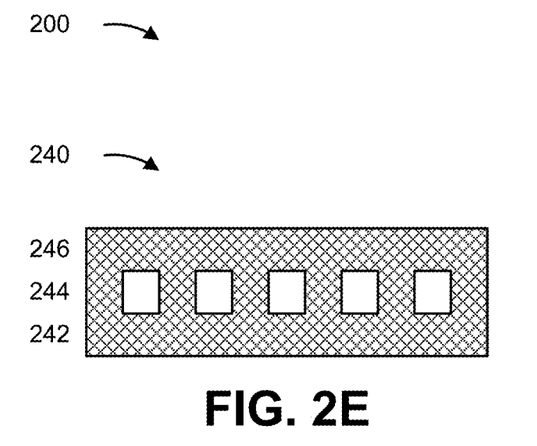

As shown in FIG. 2E, grating 240 includes a first layer 242, a second layer 244, and a third layer 246. In some implementations, first layer 242 may be a dielectric layer (e.g., SiO$_2$). In some implementations, second layer 244 may be a semiconductor (e.g., Si) and dielectric (e.g., SiO$_2$) grating. In some implementations, third layer 246 may be a dielectric (e.g., SiO$_2$) layer. In this case, layers 242, 244, and 246 form a high index contrast for grating 240.

Figure 2F:
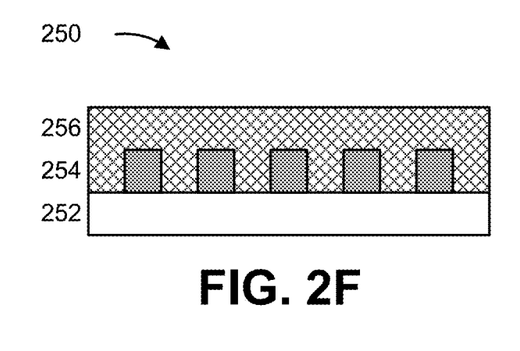

As shown in FIG. 2F, grating 250 includes a first layer 252, a second layer 254, and a third layer 256. In some implementations, first layer 252 may be a semiconductor layer (e.g., GaAs). In some implementations, second layer 254 may be a metal (e.g., Au) and dielectric (e.g., silicon nitride (SiN$_x$)) grating. In this case, second layer 254 forms a grating structure directly on a semiconductor, which may conduct current for a VCSEL. In some implementations, third layer 256 may be a dielectric (e.g., SiN$_x$) layer. In this case, third layer 256 may form a high index contrast with second layer 254.

Figure 2G:
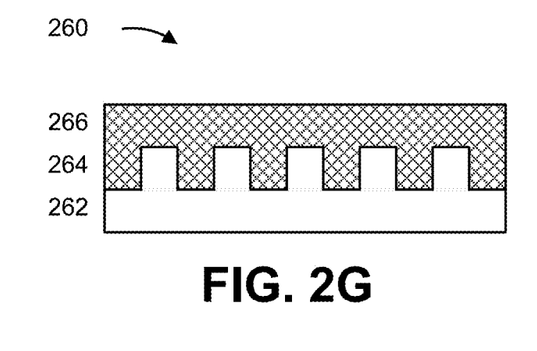

As shown in FIG. 2G, grating 260 includes a first layer 262, a second layer 264, and a third layer 266. In some implementations, first layer 262 may be a semiconductor layer (e.g., GaAs). In some implementations, second layer 264 may be a metal (e.g., Au) and semiconductor (e.g., GaAs) grating. In some implementations, third layer 266 may be a metal (e.g., Au) layer. In this case, by covering a semiconductor grating, such as grating 260, with a metal layer, current may be conducted from/to a VCSEL. In some implementations, grating 260 may be used for a bottom-emitting VCSEL.

Figure 2H:
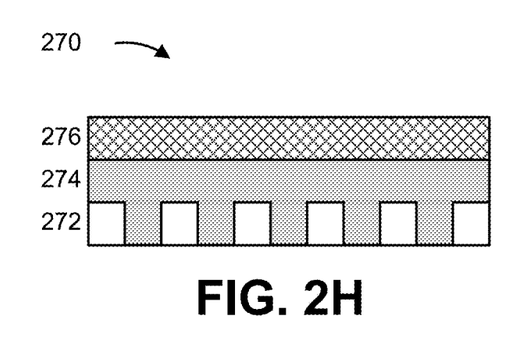

As shown in FIG. 2H, grating 270 includes a first layer 272, a second layer 274, and a third layer 276. In some implementations, first layer 272 may be a semiconductor (e.g., GaAs) and dielectric (e.g., BCB) grating. In some implementations, second layer 274 may be a spacer (e.g., BCB) layer. In this case, by covering first layer 272 with a dielectric material (e.g., BCB), a high index contrast may be achieved. In some implementations, third layer 276 may be a metal (e.g., Au) layer. In this case, third layer 276 may enable conduction for grating 270, which may be used in a bottom-emitting VCSEL.

As indicated above, FIGS. 2A-2H are provided merely examples. Other examples may differ from what is described with regard to FIGS. 2A-2H.

FIGS. 3A-3D are diagrams of examples of gratings 300-330 described herein. As shown in FIGS. 3A-3D, layer stacks 300-330 include respective sets of multiple layers to form grating structures of layer stacks 300-330. In some implementations, each layer stack 300-330 may be a part of a VCSEL.

Figure 3A:
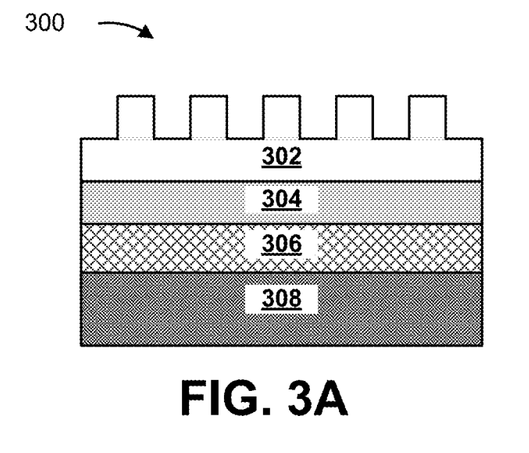
FIGS. 3A-3D are diagrams of examples of layer stacks described herein.

As shown in FIG. 3A, layer stack 300 includes a first layer 302, a second layer 304, a third layer 306, and a fourth layer 308. In some implementations, first layer 302 may be a dielectric layer. For example, first layer 302 may be castellated to form a grating structure matched to an air interface. In some implementations, second layer 304 may be a semiconductor p-contact layer. In some implementations, third layer 306 may be a semiconductor p-mirror layer. In some implementations, fourth layer 308 may include an active layer (e.g., sandwiched between barrier layers) that produces light at lasing wavelengths, or may be a spacer layer, an oxide layer, and/or the like.

Figure 3B:
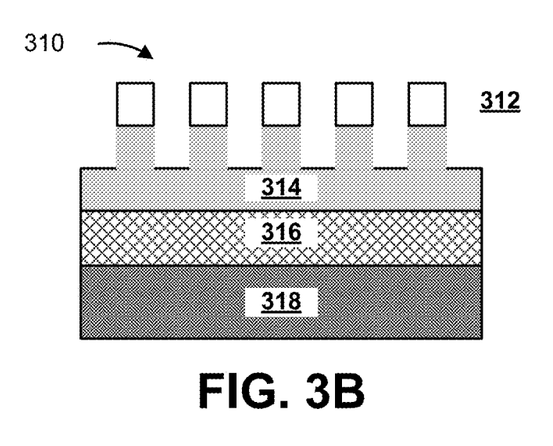

As shown in FIG. 3B, layer stack 310 includes a first layer 312, a second layer 314, a third layer 316, and a fourth layer 318. In some implementations, first layer 312 may be a dielectric layer. In some implementations, second layer 314 may be a semiconductor p-contact layer. For example, first layer 312 and a partial thickness of second layer 314 may form a castellated surface to form a grating structure matched to an air interface. In some implementations, third layer 316 may be a semiconductor p-mirror layer. In some implementations, fourth layer 318 may include an active layer and/or the like.

Figure 3C:
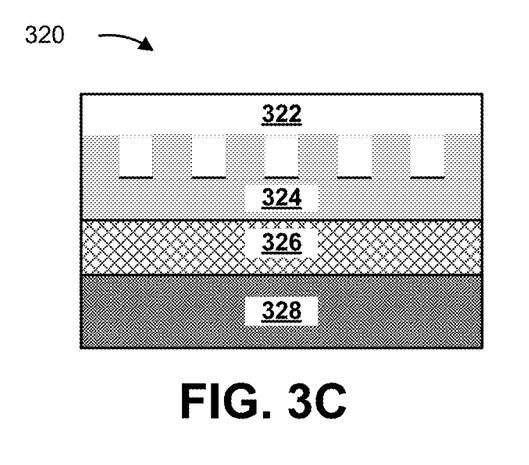

As shown in FIG. 3C, layer stack 320 includes a first layer 322, a second layer 324, a third layer 326, and a fourth layer 328. In some implementations, first layer 322 may be a dielectric layer. In some implementations, second layer 324 may be a semiconductor p-contact layer. In some implementations, second layer 324 may include a castellated structure and first layer 322 may planarize the castellated structure of second layer 324. In some implementations, third layer 326 may be a semiconductor p-mirror layer. In some implementations, fourth layer 328 may include an active layer and/or the like.

Figure 3D:
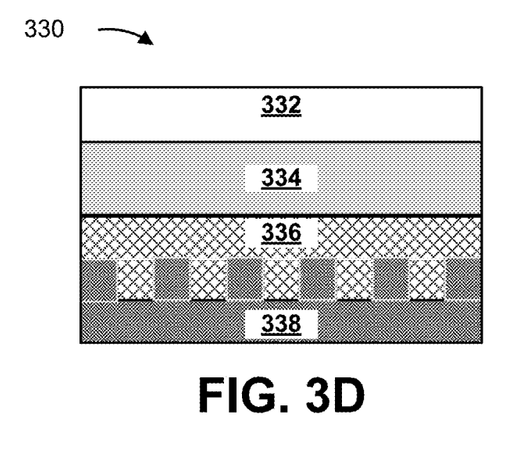

As shown in FIG. 3D, layer stack 330 includes a first layer 332, a second layer 334, a third layer 336, and a fourth layer 338. In some implementations, first layer 332 may be a dielectric layer. In some implementations, second layer 334 may be a semiconductor p-contact layer. In some implementations, third layer 336 may be a semiconductor p-mirror layer. In some implementations, fourth layer 338 may include an active layer and/or the like. In some implementations, fourth layer 338 may include a castellated structure to form a grating structure, and third layer 336 may planarize the castellated structure of fourth layer 338.

As indicated above, FIGS. 3A-3D are provided merely as examples. Other examples may differ from what is described with regard to FIGS. 3A-3D.

Figure 4A:
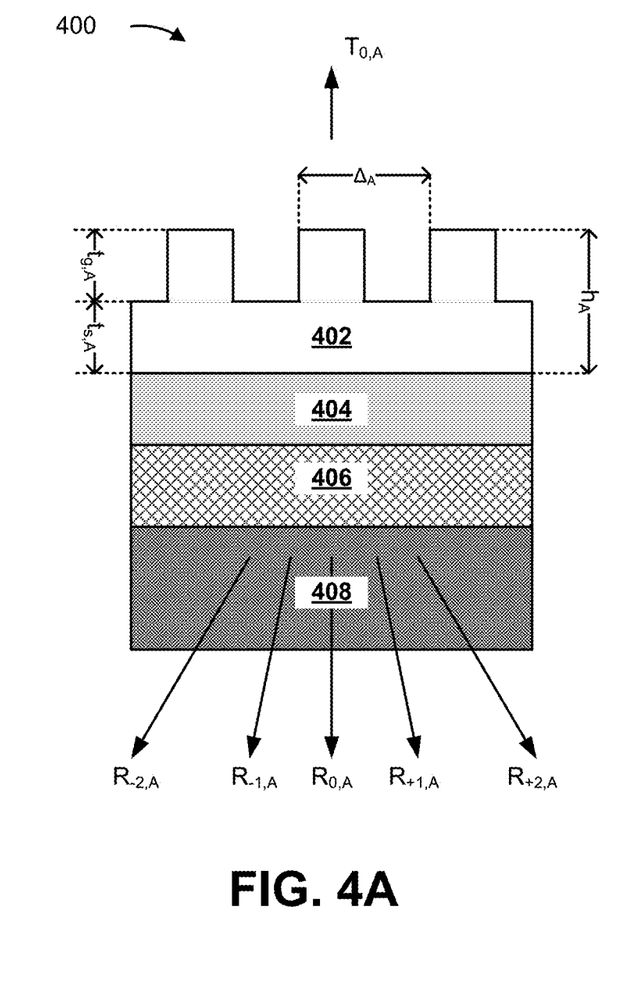
FIGS. 4A and 4B are diagrams of examples of layer stacks described herein.
Figure 4B:
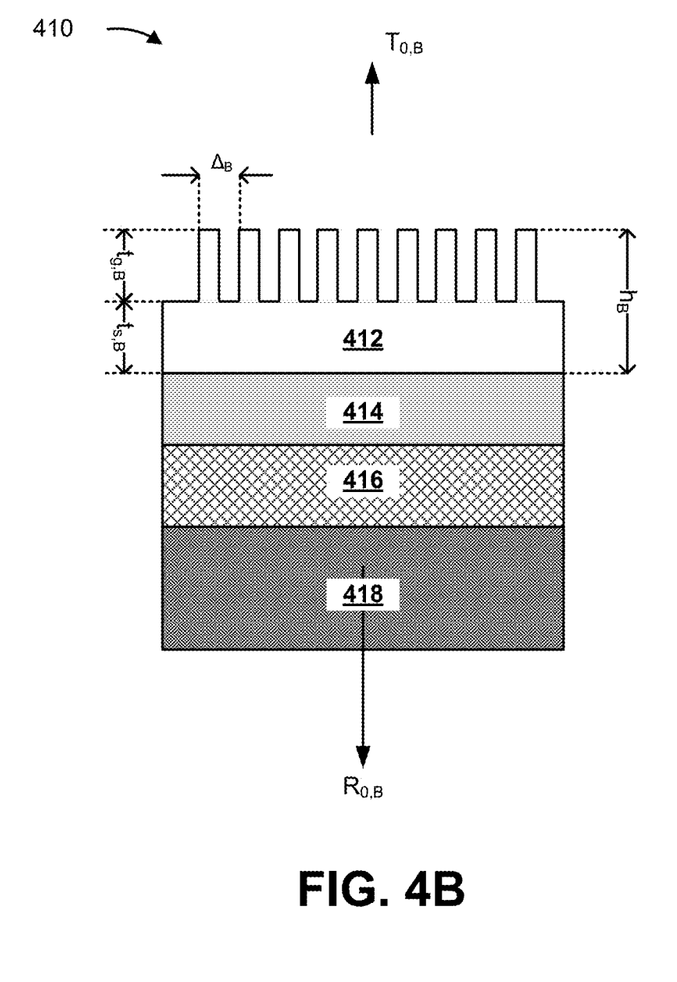

FIGS. 4A and 4B are diagrams of examples of layer stacks described herein. As shown in FIGS. 4A and 4B, layer stacks 400 and 410 include respective sets of multiple layers to form respective grating structures, and may form a portion of a VCSEL.

As shown in FIG. 4A, layer stack 400 may include a dielectric layer 402, a semiconductor layer 404 forming a p-type contact, a semiconductor mirror 406 forming a p-type mirror, and a layer 408 (e.g., an active layer and/or the like). In this case, a castellated grating structure is formed by dielectric layer 402. Similarly, as shown in FIG. 4B, layer stack 410 may include a dielectric layer 412, a semiconductor layer 414 forming a p-type contact, a semiconductor mirror 416 forming a p-type mirror, and a layer 418. In this case, a castellated grating structure is formed in dielectric layer 412. In another example, the grating structure may be formed by semiconductor layers 404/414, by layers 408/418, and/or the like.

As further shown in FIGS. 4A and 4B, differing periods, depths, and fill factors for gratings described herein may alter an amount of reflection ($R_0$) and transmission ($T_0$). Further, the differing periods, depths, and fill factors may affect an amount of higher order diffraction ($R_{+/-m}$). As shown, layer stack 400 may be associated with a grating height $h_A$, a grating depth $t_{g,A}$, a grating substrate thickness $t_{s,A}$, and a period $\Lambda_A$, which may result in a transmission $T_{0,A}$, a reflection $R_{0,A}$, and higher order diffraction $R_{-2,A}$, $R_{-1,A}$, $R_{+1,A}$, $R_{+2,A}$. Similarly, layer stack 410 may be associated with a grating height $h_B$, a grating depth $t_{g,B}$, a grating substrate thickness $t_{s,B}$, and a period $\Lambda_B$, which may result in a transmission $T_{0,B}$ and a reflection $R_{0,B}$ and suppression of higher order diffraction modes In some implementations, a grating, such as in layer stack 400 or layer stack 410 may be associated with a height of approximately 957 nm, a depth of approximately 480 nm, a pitch of approximately 600 nm, a width (e.g., of each grating pillar) of approximately 300 nm, and a fill factor of 50%. In some implementations, a grating, such as layer stack 400 or layer stack 410, may provide a threshold reflectivity. In some implementations, a grating, such as in layer stack 400 or layer stack 410 may be associated with an emission wavelength of 940 nm, a period of 600 nm, a depth of 480 nm, and a fill factor of 50%.

As indicated above, FIGS. 4A and 4B are provided merely as examples. Other examples may differ from what is described with regard to FIGS. 4A and 4B.

In this way, a grating for a VCSEL may be associated with a period, a depth, and a fill factor of a grating structure of the grating that is configured to achieve greater than a threshold level of efficiency for the VCSEL, less than a threshold current increase caused by power loss from higher order diffraction associated with the grating structure, and greater than a threshold polarization selectivity at an emission wavelength of the VCSEL.

The foregoing disclosure provides illustration and description, but is not intended to be exhaustive or to limit the implementations to the precise forms disclosed. Modifications and variations may be made in light of the above disclosure or may be acquired from practice of the implementations.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A vertical-cavity surface-emitting laser (VCSEL), comprising:
at least one layer forming a grating structure with a selected period, depth, and fill factor,
wherein the period, the depth, and the fill factor of the grating structure are configured to achieve greater than a threshold level of efficiency for the VCSEL, less than a threshold current increase caused by power loss from higher order diffraction associated with the grating structure, and greater than a threshold polarization selectivity at an emission wavelength of the VCSEL.

2. The VCSEL of claim 1, wherein the threshold polarization selectivity is greater than or equal to 10 decibels (dB) polarization selectivity.

3. The VCSEL of claim 1, wherein the threshold current increase is less than 10% current increase.

4. The VCSEL of claim 1, wherein the threshold level of efficiency is greater than 32% wall-plug efficiency.

5. The VCSEL of claim 1, wherein the threshold polarization selectivity is greater than or equal to 10 decibels (dB) polarization selectivity, the threshold current increase is less than 10% current increase, and the threshold level of efficiency is greater than 32% wall-plug efficiency.

6. The VCSEL of claim 1, wherein the emission wavelength is between 850 nm and 1550 nm.

7. The VCSEL of claim 1, wherein an index contrast of the grating structure is less than a threshold index contrast.

8. The VCSEL of claim 1, wherein the period, the depth, and the fill factor of the grating structure are configured based on a refractive index of the at least one layer.

9. The VCSEL of claim 1, wherein the at least one layer comprises three layers forming the grating structure.

10. The VCSEL of claim 1, wherein the grating structure forms a castellated surface or a planarized surface.

11. The VCSEL of claim 1, wherein the emission wavelength is 940 nanometers (nm), the period is 600 nm, the depth is 480 nm, and the fill factor is 50%.

12. A high-efficiency hybrid grating of a vertical-cavity surface-emitting laser (VCSEL), comprising:
a grating including one or more layers, wherein at least one of the grating one or more layers forms a grating structure with a particular period, depth, and fill factor, wherein the one or more layers are continuous without an airgap separating portions of the one or more layers, and wherein the particular period, depth, and fill factor of the grating structure are configured to achieve high efficiency, less than a threshold amount of higher-order diffraction, and greater than a threshold polarization selectivity at an emission wavelength of the VCSEL.

13. The high-efficiency hybrid grating of claim 12, wherein the one or more layers comprise:
a semiconductor layer,
a semiconductor and dielectric grating disposed on the semiconductor layer, and
a metal layer disposed on the semiconductor and dielectric grating.

14. The high-efficiency hybrid grating of claim 12, wherein the one or more layers comprise a dielectric layer.

15. The high-efficiency hybrid grating of claim 12, wherein the one or more layers comprise:
a semiconductor layer,
a metal and dielectric grating disposed on the semiconductor layer, and
a dielectric layer disposed on the metal and dielectric grating.

16. The high-efficiency hybrid grating of claim 12, wherein the one or more layers comprises:
a semiconductor layer,
a metal and semiconductor grating disposed on the semiconductor layer, and
a metal layer disposed on the metal and semiconductor grating.

17. The high-efficiency hybrid grating of claim 12, wherein the one or more layers comprises:
a semiconductor and dielectric grating,
a spacer layer disposed on the semiconductor and dielectric grating, and
a metal layer disposed on the spacer layer.

18. An optical system, comprising:
a vertical-cavity surface-emitting laser (VCSEL),
a grating disposed in an optical path of the VCSEL, comprising:
a set of grating layers with a first refractive index and of a first material,
wherein a difference between the first refractive index and a second refractive index of an interface matched to the set of grating layers is less than a threshold difference,
wherein the interface is of a second material that is different from the first material,
wherein the grating is associated with a threshold thermal boundary resistance, and
wherein a period, a depth, and a fill factor of the grating are configured to achieve high efficiency, less than a threshold current increase, and greater than a threshold polarization selectivity at an emission wavelength of the VCSEL.

19. The optical system of claim 18, wherein the VCSEL is a top-emitting VCSEL.

20. The optical system of claim 18, wherein the VCSEL is a bottom-emitting VCSEL.

* * * * *

UNITED STATES PATENT AND TRADEMARK OFFICE
CERTIFICATE OF CORRECTION

PATENT NO. : 10,826,274 B2
APPLICATION NO. : 16/269139
DATED : November 3, 2020
INVENTOR(S) : Pengfei Qiao et al.

Page 1 of 1

It is certified that error appears in the above-identified patent and that said Letters Patent is hereby corrected as shown below:

In the Claims

In Claim 12, Column 9, Line 1, "one of the grating one or more layers" should be changed to --one of the one or more layers--;

In Claim 18, Column 10, Line 21, "associated with a threshold thermal boundary resistance," should be changed to --associated with a thermal boundary resistance,--.

Signed and Sealed this
Twenty-second Day of December, 2020

Andrei Iancu
*Director of the United States Patent and Trademark Office*